(12) United States Patent
Kouwenhoven

(10) Patent No.: US 8,401,504 B2
(45) Date of Patent: *Mar. 19, 2013

(54) EXTENDED RANGE RMS-DC CONVERTER

(75) Inventor: Michael Hendrikus Laurentius Kouwenhoven, Zoetermeer (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/759,568

(22) Filed: Apr. 13, 2010

(65) Prior Publication Data

US 2010/0194461 A1 Aug. 5, 2010

Related U.S. Application Data

(63) Continuation of application No. 11/498,450, filed on Aug. 2, 2006, now Pat. No. 7,697,909, which is a continuation-in-part of application No. 10/932,469, filed on Sep. 1, 2004, now Pat. No. 7,197,292.

(51) Int. Cl.
*H04B 1/10* (2006.01)

(52) U.S. Cl. .................. 455/226.1; 455/296; 327/348; 702/198

(58) Field of Classification Search .............. 455/226.1, 455/226.2, 296, 311; 327/348; 702/198
See application file for complete search history.

(56) References Cited

U.S. PATENT DOCUMENTS

| | | | |
|---|---|---|---|
| 3,723,845 | A | 3/1973 | Duckworth |
| 5,486,788 | A | 1/1996 | Schlager et al. |
| 5,489,868 | A | 2/1996 | Gilbert |
| 6,172,549 | B1 | 1/2001 | Gilbert |
| 6,204,719 | B1 | 3/2001 | Gilbert |
| 6,348,829 | B1 | 2/2002 | Gilbert |
| 6,359,576 | B1 | 3/2002 | Petrofsky |
| 6,380,801 | B1 | 4/2002 | McCartney |
| 6,429,720 | B1 | 8/2002 | Gilbert |
| 6,445,726 | B1 | 9/2002 | Gharpurey |
| 6,549,057 | B1 | 4/2003 | Gilbert |
| 6,639,460 | B1 | 10/2003 | Botker |
| 6,651,036 | B2 * | 11/2003 | Petrofsky ............ 702/198 |
| 6,674,322 | B2 | 1/2004 | Motz |

(Continued)

FOREIGN PATENT DOCUMENTS

| KR | 1020000011501 | 2/2000 |
|---|---|---|
| KR | 1020050048692 | 5/2005 |

OTHER PUBLICATIONS

Gilbert, Barrie. "A Novel Technique for RMS-DC Conversion Based on the Difference of Squares". Electronics Letters, vol. 11, No. 8, Apr. 17, 1975. pp. 181-182.

(Continued)

*Primary Examiner* — Nguyen Vo
(74) *Attorney, Agent, or Firm* — Warren L. Frantz; Wade J. Brady, III; Frederick J. Telecky, Jr.

(57) ABSTRACT

Described herein is technology for, among other things, reducing offset errors in RMS-to-DC converters. The technology involves generating first and second feedback signals with first and second feedback paths respectively. A multiplier is then employed to receive first and second signals and provide a third signal based on multiplying the first signal and the second signal. The first signal is based on an input signal and the first feedback signal, and the second signal is based on the input signal and the second feedback signal. A chopper is then employed to receive an output signal, which is based on the third signal, and a chopping signal, and in turn provide a fourth signal based on multiplying the output signal with the chopping signal. As a consequence, the fourth signal represents the output signal shifted to a frequency different than that of low-frequency noise components of the first and second signals.

7 Claims, 9 Drawing Sheets

U.S. PATENT DOCUMENTS

| | | | |
|---|---|---|---|
| 6,707,336 | B2 | 3/2004 | Reber |
| 7,002,394 | B1 | 2/2006 | Gilbert |
| 7,197,292 | B1 | 3/2007 | Kouwenhoven et al. |
| 7,342,431 | B2 | 3/2008 | Zou |
| 7,697,909 | B2 * | 4/2010 | Kouwenhoven ............ 455/226.1 |
| 2002/0103627 | A1 | 8/2002 | Petrofsky |
| 2003/0030478 | A1 | 2/2003 | Gilbert |
| 2003/0122614 | A1 * | 7/2003 | Gilbert .......................... 327/560 |

OTHER PUBLICATIONS

M. Kouwenhoven and A. Van Staveren. "Mean-Square Power Detector with Integrated Offset Chopper". ISSCC Digest of Technical Papers, pp. 92-93, Feb. 2005.

Abidi, Asad A., 2004, "RF CMOS Comes of Age." IEEE Journal of Solid-State Circuits 39:4 (April) 549-561.

Bakker, Anton et al., 2000, "A CMOS Nested Chopper Instrumentation Amplifier with 100nV Offset." IEEE International Solid-State Circuits Conference (February) 156-157, 452.

Bult, Klaas and Hans Wallinga, 1987, "A Class of Analog CMOS Circuits Based on the Square-Law Characteristics of an MOS Transistor in Saturation." IEEE Journal of Solid-State Circuits 22:3 (June) 357-365.

Enz, Christian C. and Gabor C. Temes, 1996, "Circuit Techniques for Reducing the Effects of Op-Amp Imperfections: Autozeroing, Correlated Double Sampling, and Chopper Stabilization." Proceedings of the IEEE 84:11 (November) 1584-1614.

Gilbert, Barrie, 1968, "A New Wide-Band Amplifier Technique." IEEE Journal of Solid-State Circuits 3:4 (December) 353-365.

Gilbert, Barrie, 1968, "A Precise Four-Quadrant Multiplier with Subnanosecond Response." IEEE Journal of Solid-State Circuits 3:4 (December) 365-373.

Kimura, Katsuji, 1994, "A Bipolar Four-Quadrant Analog Quarter-Square Multiplier Consisting of Unbalanced Emitter-coupled Pairs and Expansions of its Input Ranges." IEEE Journal of Solid-State Circuits 29:1 (January) 46-55.

Kimura, Katsuji, 1996, "Some Circuit Design Techniques for Low-Voltage Analog Functional Elements Using Squaring Circuits." IEEE Transactions on Circuits and Systems I 43:7 (July) 559-576.

Soo, David C. and Robert G. Meyer, 1982, "A Four-Quadrant NMOS Analog Multiplier." IEEE Journal of Solid-State Circuits 17:6 (December) 1174-1178.

PCT International Search Report. PCT/US2007/017370. International Filing Date: Aug. 2, 2007. Applicant: National Semiconductor Corporation et al. Date of Mailing: Jan. 4, 2008.

Notice of Allowance Date mailed Dec. 14, 2006; U.S. Appl. No. 10/932,469.

PCT International Preliminary Report on Patentability. PCT/US2007/017370. International Filing Date: Aug. 2, 2007. Applicant: National Semiconductor Corporation et al. Date of Mailing: Feb. 12, 2009.

Notice of Allowance Date mailed Aug. 6, 2009; U.S. Appl. No. 11/498,450.

Notice of Allowance Date mailed Nov. 23, 2009; U.S. Appl. No. 11/498,450.

M. Kouwenhoven and A. Van Staveren. "A 2GHz Mean-Square Power Detector with Integrated Offset Chopper". ISSCC Digest of Technical Papers, pp. 19-20, Feb. 2005.

* cited by examiner

EXTENDED RANGE RMS-DC CONVERTER

CROSS REFERENCE TO RELATED APPLICATIONS

This patent application is a continuation of and claims the benefit of U.S. patent application Ser. No. 11/498,450, now U.S. Pat. No. 7,697,909, entitled "Extended Range RMS-DC Converter", by Michael Hendrikus Laurentius Kouwenhoven, filed Aug. 2, 2006, which is a continuation-in-part of U.S. patent application Ser. No. 10/932,469, now U.S. Pat. No. 7,197,292, entitled "Chopper Stabilized Analog Multiplier" by Kouwenhoven et al., filed Sep. 1, 2004, which are hereby incorporated by reference.

FIELD

The present invention relates to RMS-DC converters, and in particular, to a method and circuit for extending the dynamic range of and eliminating an offset noise at or near zero Hertz for RMS-DC converters.

BACKGROUND

RMS-to-DC converters are electronic circuits that generate a DC output signal (either current or voltage), proportional to the Root-Mean-Square value (the square-root of the power) of the input signal. Such devices are used in a variety of applications where a measure of the signal strength is important, such as test and measurement and communications. A specific property of devices that produce an output based on the RMS value of the input (the relationship between RMS input value and DC output is not necessarily linear, but can also be quadratic, logarithmic or another nonlinear function) is that their response is insensitive to the precise shape of the input signal; more specifically, it is insensitive to peak-to-average power ratio variations. This is especially important in applications were the converter input signals can attain multiple different formats (modulation parameters, variable coding, etc.) and thus different peak-to-average power ratios. In such systems, signal strength measurement using an RMS-to-DC converter significantly reduces the need for factory calibration.

The two key operations to be implemented by any RMS-to-DC converter are squaring of the input signal, and low-pass filtering of the resulting squared signal. In addition, other functions like taking the square-root (to create a linear RMS-DC conversion) or logarithm (for LOG-RMS-DC conversion) of this means-square value can be included to change the overall input-output relationship according to needs. In order to maximize the performance of the converter, the aforementioned operations should be realized in such a way that circuit imperfections such as offset, temperature drift, etc. have a minimal impact on the converter overall transfer.

Direct RMS-to-DC Conversion

The most straight-forward method of implementing an RMS-to-DC converter, direct RMS-to-DC conversion, is to apply all required operations sequentially, as illustrated by device 100 of FIG. 1. First, the input signal x is squared 110, then low-pass filtered 120, and finally the square-root operation 130 is applied. The overall transfer of this converter can be expressed as:

$$y = K_{sqrt}\sqrt{\overline{K_{sq}x^2}}, \quad (1)$$

and is thus dependent on both the conversion gain from input x to output y of squarer 110, $K_{sq}$, and the conversion gain of square-root circuit 130, $K_{sqrt}$. Both conversion gains are highly dependent on transistor device characteristics, and therefore are subject to temperature drift, frequency dependence, and other sources of inaccuracy. Since the signal of interest at the output of the squarer is situated at DC (zero frequency), offsets adding to the circuit at locations $x_1$ and $x_2$ in FIG. 1 significantly limit the sensitivity of the converter for small input signals. This is illustrated by graph 200 of FIG. 2. The dashed ideal offset-free RMS-to-DC converter transfer maintains its sensitivity down to a zero input signal level, while a practical converter, impaired by internal offsets, is usable only down to an input signal level $x_{min}$. Reduction of internal offsets will therefore extend the converter dynamic range.

RMS-to-DC Conversion Based on the Difference of Squares

FIG. 3 illustrates one device 300 of RMS-to-DC conversion that eliminates the conversion gain of the squarer and square-root circuit from the overall converter transfer. The method employed by device 300 is also known as RMS-to-DC conversion based on the "difference of squares." In this configuration, a linear analog multiplier 310 is used to generate the difference of the square of the input signal (x) and the square of the output signal (y), i.e. $x^2 - y^2$. This is achieved by supplying one multiplier input with the sum of the input signal and the output signal, and the other input with the difference of these signals. The resulting difference of squares is fed through lowpass filter 320 and supplied to a high-gain error amplifier 330. When the gain A of the amplifier 330 approaches infinity, the output signal y becomes proportional to the RMS value of the input signal x. This can be seen as follows. Starting at the output and following the feedback backwards through the multiplier, the relation between input signal x and output signal y can be expressed as:

$$y = AK_m[\overline{x^2} - \beta_1\beta_2\overline{y^2} + (\beta_1-\beta_2)\overline{xy}] \quad (2)$$

Since the output signal is DC, the mean value of y equals y itself, and the mean-square value equals the square of y. Furthermore, since the input signal x for useful RMS-to-DC converter applications is zero-mean, the last term on the right of Equation 2 vanishes (this also occurs independent of x when $\beta_1=\beta_2$), and y becomes:

$$y = \frac{-1}{2AK_m\beta_1\beta_2} + \sqrt{\frac{1}{(2AK_m\beta_1\beta_2)^2} + \frac{\overline{x^2}}{\beta_1\beta_2}} \quad (3)$$

which approaches the following expression for high error amplifier gain levels:

$$\lim_{A \to \infty} y = \sqrt{\frac{\overline{x^2}}{\beta_1\beta_2}} \quad (4)$$

Consequently, for high loopgain levels, the overall RMS-to-DC converter transfer is independent of the multiplier conversion gain $K_m$, and only determined by the (low-frequency) feedback factors $\beta_1$ and $\beta_2$. These can be accurately realized, for example, by passive components. Offset though, especially offset adding to the input and output of the multiplier, can still significantly limit the sensitivity of this type of converter for small input signal levels.

FIG. 4 illustrates another device 400 for generating the difference of squares using two squaring circuits 410 and 420. Again, the amplifier 440 in the loop drives the difference between the mean-square value of the input signal and the squared output signal to zero, such that the output signal approaches:

$$\lim_{A \to \infty} y = \sqrt{\frac{K_{sq1}}{K_{sq2}} \overline{x^2}} \tag{5}$$

Thus in this approach, the accuracy of the overall converter transfer is based on matching between the conversion gain of the two squaring circuits 410 and 420, instead of the squarer conversion gain itself. Offset, especially offset adding to the squarer output signals, still affects the sensitivity at low input signal levels. Therefore, careful IC layout and trimming are required to maximize the converter dynamic range.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Described herein is technology for, among other things, reducing offset errors in a RMS-to-DC converter. The technology involves generating a first feedback signal with a first feedback path and a second feedback signal with a second feedback path. A multiplier is then employed to receive a first and second signal and provide a third signal based on multiplying the first signal and the second signal. The first signal is based on an input signal and the first feedback signal, and the second signal is based on the input signal and the second feedback signal. A chopper is then employed to receive an output signal, which is based on the third signal, and a chopping signal, and in turn provide a fourth signal based on multiplying the output signal with the chopping signal to the first and second feedback paths. As a consequence, the fourth signal represents the output signal shifted to a frequency different than that of low-frequency noise components of the first and second signals.

Thus, embodiments provide for improved sensitivity in RMS-to-DC converters for very small input signals. Embodiments also improve the temperature stability of such converters by substantially eliminating temperature dependent offsets. Moreover, embodiments provide for low-cost fabrication of high-performance RMS-to-DC converters by substantially eliminating the need for expensive offset trim and calibration procedures. Additionally, embodiments allow for the extension of the dynamic range of such converters by means of nonlinear feedback inside the converters and input scaling using a variable gain amplifier.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Throughout the specification, references are made to frequency components of signals, voltages, or currents. A signal, a voltage, or a current may include a plurality of frequency components. Some of those frequency components may be generated intentionally, while others may be generated unintentionally by various processes and circuitry. The frequency component of a signal may be shifted to a different frequency in a process such as multiplication of the signal with another signal. Accordingly, the frequency components mentioned in the specification, refer to those of interest, and signals, voltages, or currents should not be construed as comprising only those frequency components mentioned in the specification.

As used in the specification, "chopping" refers to multiplication of a first signal that includes a first frequency $f_1$ with a second signal that includes a second frequency $f_2$, so that an output signal includes at least two frequency components. One frequency component of the output signal may be substantially at $f_1-f_2$, and another frequency component of the output signal may be substantially at $f_1+f_2$.

Briefly stated, the present invention is directed to extending the dynamic range, improving the sensitivity at very small input signals, improving the temperature stability, and eliminating temperature dependent offsets of RMS to DC converters. The signals may be currents or voltages that are continuous in amplitude and also continuous in time. RMS-DC converters may be implemented in a multitude of applications, ranging from instrumentation systems to communication equipment.

Figure 1:
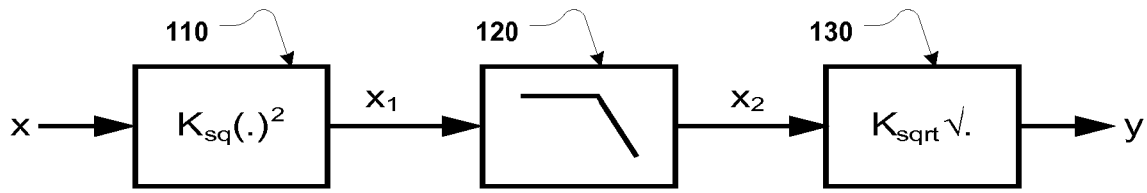
FIG. 1 is a block diagram of direct RMS-to-DC conversion.
Figure 2:
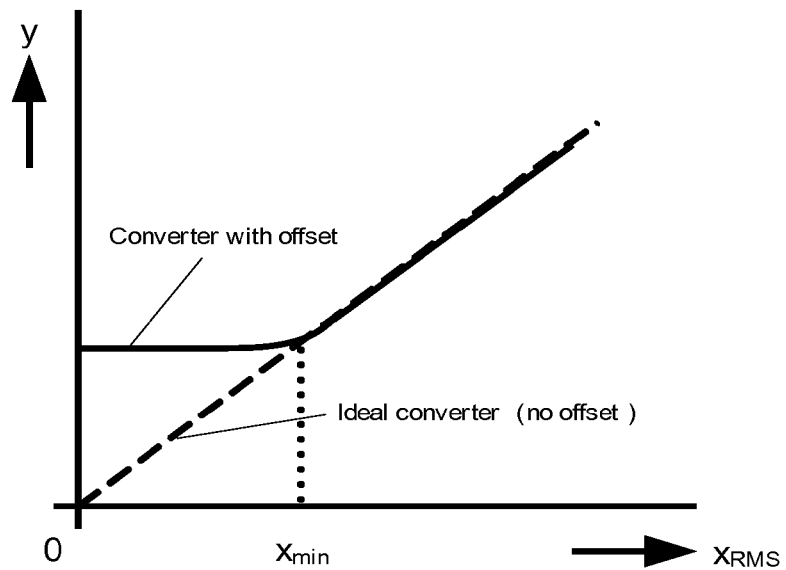
FIG. 2 is a graph illustrating the ideal transfer characteristic of an RMS-to-DC converter versus that observed in common RMS-to-DC converters.
Figure 3:
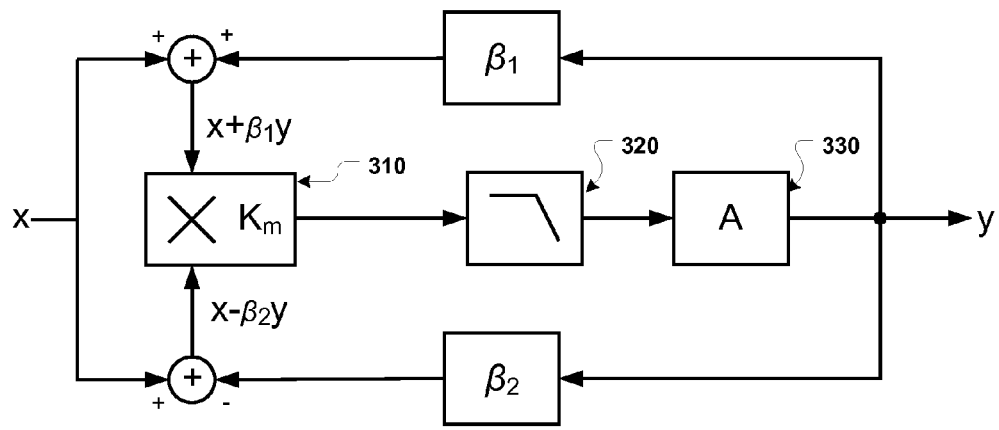
FIG. 3 is a block diagram of RMS-to-DC conversion based on the difference of squares.
Figure 4:
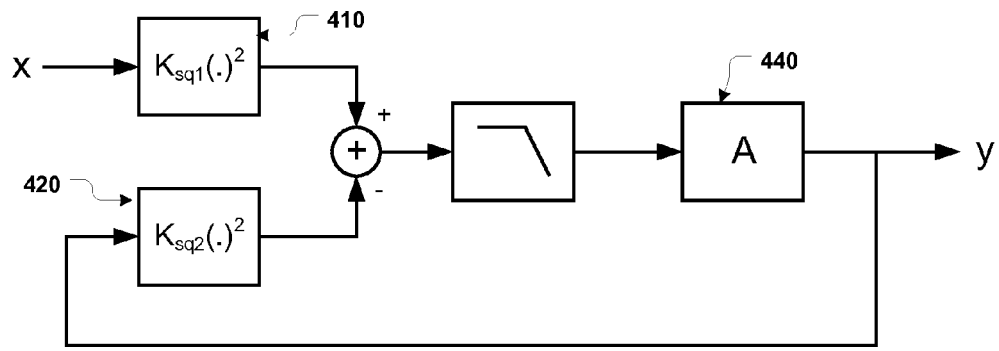
FIG. 4 is a block diagram of RMS-to-DC conversion using two squaring circuits.
Figure 5:
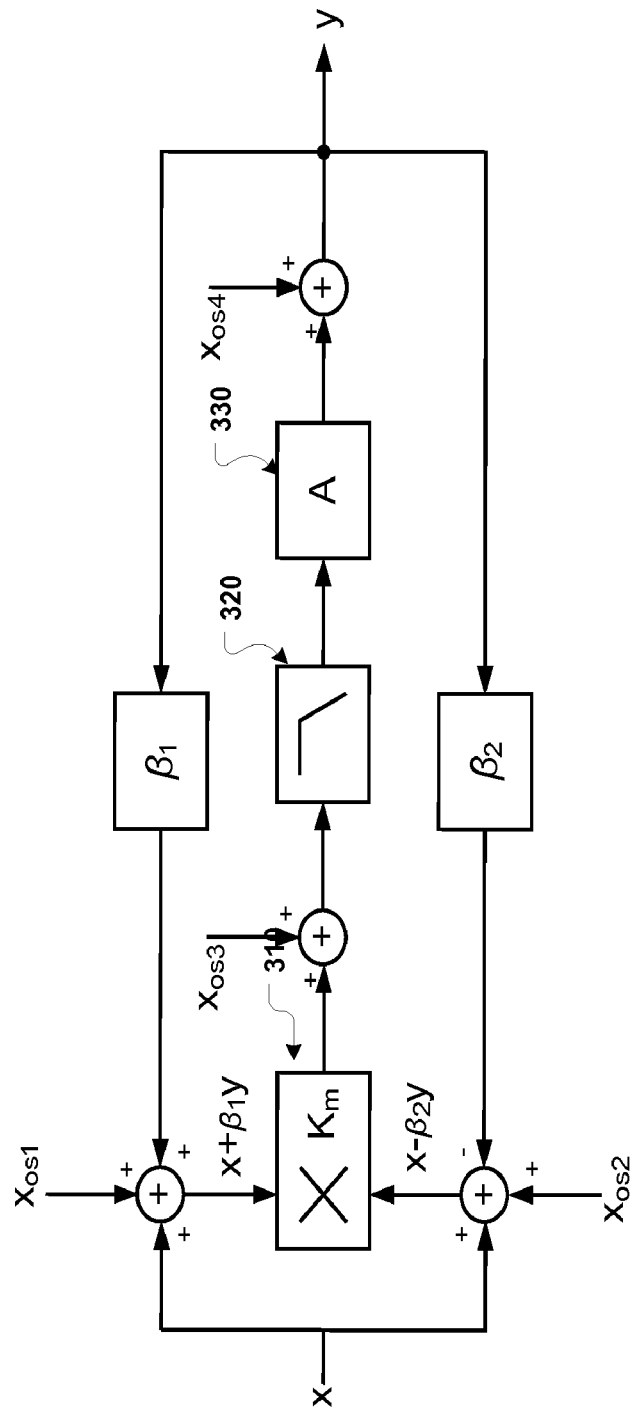
FIG. 5 is a block diagram depicting the topology of FIG. 3 including offsets at critical nodes.

In order to demonstrate the impact of offset on the RMS-to-DC converter overall transfer, FIG. 5 illustrates a device 500 depicting the topology of FIG. 3 including offsets $X_{os1}$ through $X_{os4}$ at critical nodes. Taking into account that the input signal x is zero-mean and the output signal y is DC, the transfer of this device in the presence of offsets can be expressed as:

$$y = \frac{-1}{2AK_m\beta_1\beta_2} + \frac{x_{os2}}{2\beta_2} + \frac{x_{os1}}{2\beta_1} + \sqrt{\left(\frac{1}{2AK_m\beta_1\beta_2} + \frac{x_{os2}}{2\beta_2} + \frac{x_{os1}}{2\beta_1}\right)^2 + \frac{x_{os4}}{AK_m\beta_1\beta_2} + \frac{x_{os3}}{K_m\beta_1\beta_2} + \frac{\overline{x^2}}{\beta_1\beta_2}} \quad (6)$$

which reduces for high gain levels A to:

$$y = \frac{x_{os2}}{2\beta_2} - \frac{x_{os1}}{2\beta_1} + \sqrt{\left(\frac{x_{os2}}{2\beta_2} + \frac{x_{os1}}{2\beta_1}\right)^2 + \frac{x_{os3}}{K_m\beta_1\beta_2} + \frac{\overline{x^2}}{\beta_1\beta_2}}. \quad (7)$$

Consequently, for high loopgain levels, this topology is intrinsically insensitive to offset $X_{os4}$, but it is sensitive to offsets $X_{os1}$-$X_{os3}$, located directly at the multiplier inputs and output. The insensitivity for $x_{os4}$ is also seen directly from FIG. 5; it vanishes when transformed from the output of the amplifier A to the input, since it is divided by the gain A. Therefore, for the purposes of the present discussion, $x_{os4}$ will be disregarded.

Figure 6:
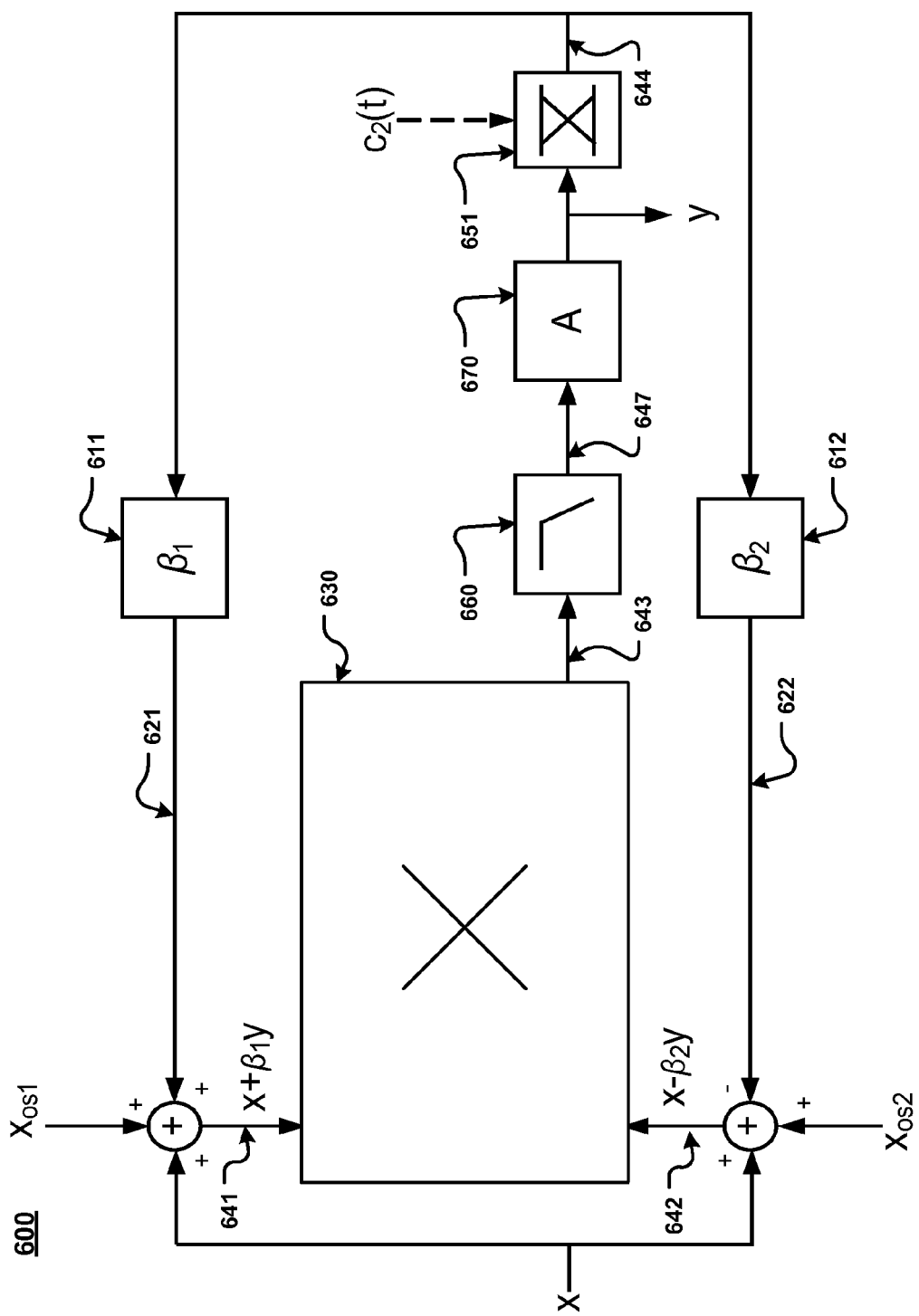
FIG. 6 is a block diagram of an RMS-to-DC converter, in accordance with an embodiment of the present invention.

FIG. 6 illustrates an RMS-to-DC converter 600, in accordance with an embodiment of the present invention. Converter 600 includes feedback path 611, which generates feedback signal 621, and feedback path 612, which generates feedback signal 622. Converter 600 also includes a multiplier circuit 630 that is coupled to receive signal 641 and signal 642. Signal 641 is based on the input signal x and feedback signal 621. In one embodiment, signal 641 represents the addition of the input signal x and the feedback signal 621. Signal 642 is based on the input signal x and feedback signal 622. In one embodiment, signal 642 represents feedback signal 622 subtracted from the input signal x. Multiplier circuit 630 is further coupled to provide signal 643, which is based on the multiplication of signal 641 and signal 642.

Figure 7:
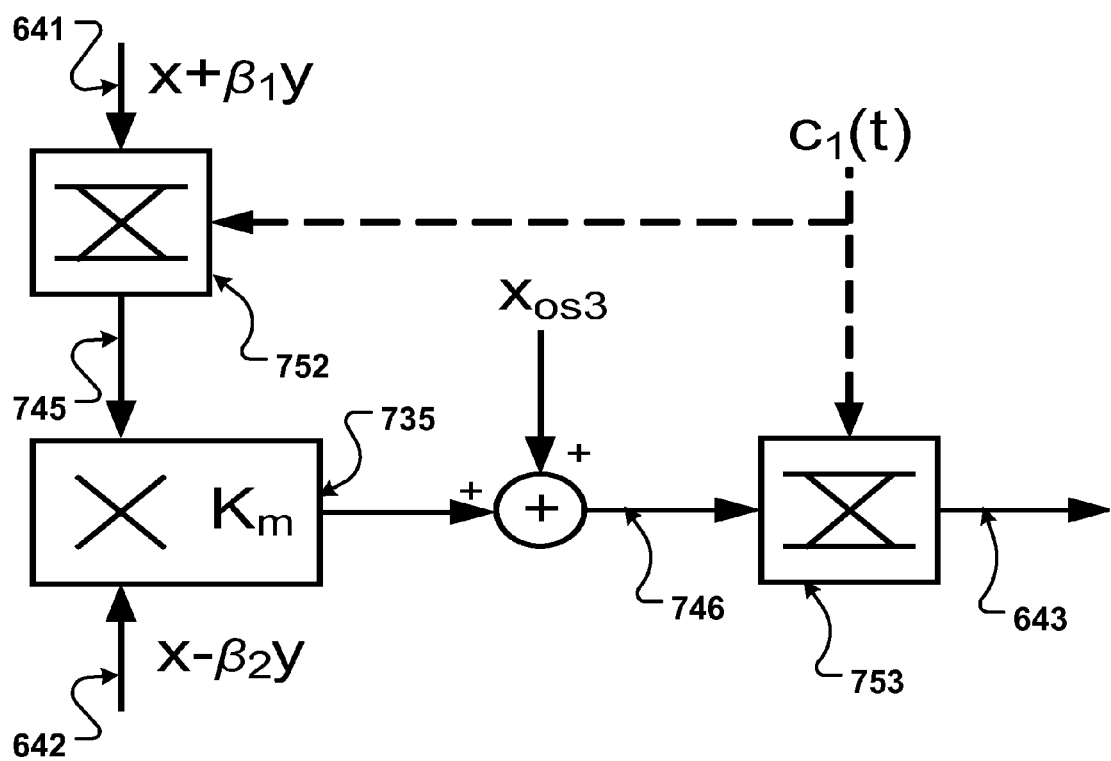
FIG. 7 is a block diagram of a multiplier circuit, in accordance with an embodiment of the present invention.

FIG. 7 illustrates a multiplier circuit 700, in accordance with an embodiment of the present invention. It is appreciated that multiplier circuit 630 of FIG. 6 may be achieved in a number of ways. Multiplier circuit 700 of FIG. 7 is intended to be an illustration of one manner of achieving multiplier circuit 630, and as such is not intended to limit multiplier 630 solely to the topography illustrated in FIG. 7.

With reference to FIG. 7, multiplier circuit 700 includes chopper 752, which is coupled to receive chopping signal $c_1(t)$ and signal 641. Chopper 752 is configured to provide signal 745, which is based on multiplying chopping signal $c_1(t)$ and signal 641. Multiplier circuit 700 also includes a second multiplier circuit 735, which is coupled to receive signal 745 and signal 642. Multiplier circuit 735 is configured to provide signal 746, which is based on multiplying signal 745 and signal 642. Multiplier circuit 700 also includes chopper circuit 753, which is coupled to receive signal 746 and chopping signal $c_1(t)$. Chopper circuit 753 is configured to provide signal 643 which is based on multiplying signal 746 with chopping signal $c_1(t)$. A consequence of this multiplication is that the offset $X_{OS3}$ is up-converted to a higher frequency. In order for offset $X_{OS3}$ to be sufficiently reduced, the chopping signal $c_1(t)$ should ideally meet the following requirements:

$$\overline{c_2(t)} = 0$$

$$c_2(t)^2 = C, \quad (8)$$

where C represents an arbitrary constant unequal to zero. By means of the two chopper circuits 752 and 753, it is ensured that the intended multiplier output component, the difference of the squares of x and y, does not coincide in frequency with the multiplier output offset $X_{os3}$ at any point in the topology. Due to the chopper circuit 752 at the input of the multiplier 735, the intended signal component at the output of the multiplier 735 is not located at DC, the "frequency" of the offset $X_{os3}$, but rather at the frequency of the chopping signal $c_1(t)$. At the output of chopping circuit 753, the intended signal component is located at DC, while the offset $X_{os3}$ is located at the chopper frequency. In FIG. 7, the input chopping circuit 752 is placed before the multiplier input that effectively receives the sum of the input signal x and the output signal y (i.e., signal 641). However, it should be appreciated that the same functionality and mechanism that eliminates offset $X_{os3}$ is obtained when the input chopping circuit 752 is placed before the other multiplier input that effectively receives the difference of x and y (i.e., signal 642).

With reference again to FIG. 6, converter 600 also includes a chopper 651 that is coupled to receive chopping signal $c_2(t)$ and output signal y, which is based on signal 643. Chopper 651 is configured to provide signal 644 to feedback path 611 and feedback path 612. Signal 644 is therefore based on multiplying output signal y with chopping signal $c_2(t)$. A consequence of this multiplication is that the output signal y is shifted to a higher frequency and can therefore be distinguished from $X_{OS1}$ and $X_{OS2}$, which have frequencies substantially equal to zero.

In one embodiment, converter 600 also includes a lowpass filter (LPF) 660 coupled to receive signal 643 and in turn provide signal 647, which consists essentially of signal 643 without offset $X_{os3}$. The LPF 660 bandwidth should be such that it suppresses the chopper frequency corresponding to chopping signal $c_1(t)$ (and thus $X_{os3}$) but passes the intended output signal component. In one embodiment, converter 600 also includes a high-gain amplifier 670 coupled to receive signal 647 and provide the output signal y.

Thus, in the configurations illustrated in FIGS. 6 and 7, the DC output signal of the converter, y, is first converted to the frequency of chopper signal $c_2(t)$ before it is added or subtracted from the input signal. In this way, the input signal x and the chopped output signal $c_2(t)$ y do not coincide in frequency with the offsets $X_{os1}$ and $X_{os2}$. For proper operation of the converter, it is important that the frequency of $c_1(t)$ is substantially different from the frequency of $c_2(t)$ and the input signal x; cross-terms between these signals should be suppressed by the lowpass filter in the loop.

Figure 8:
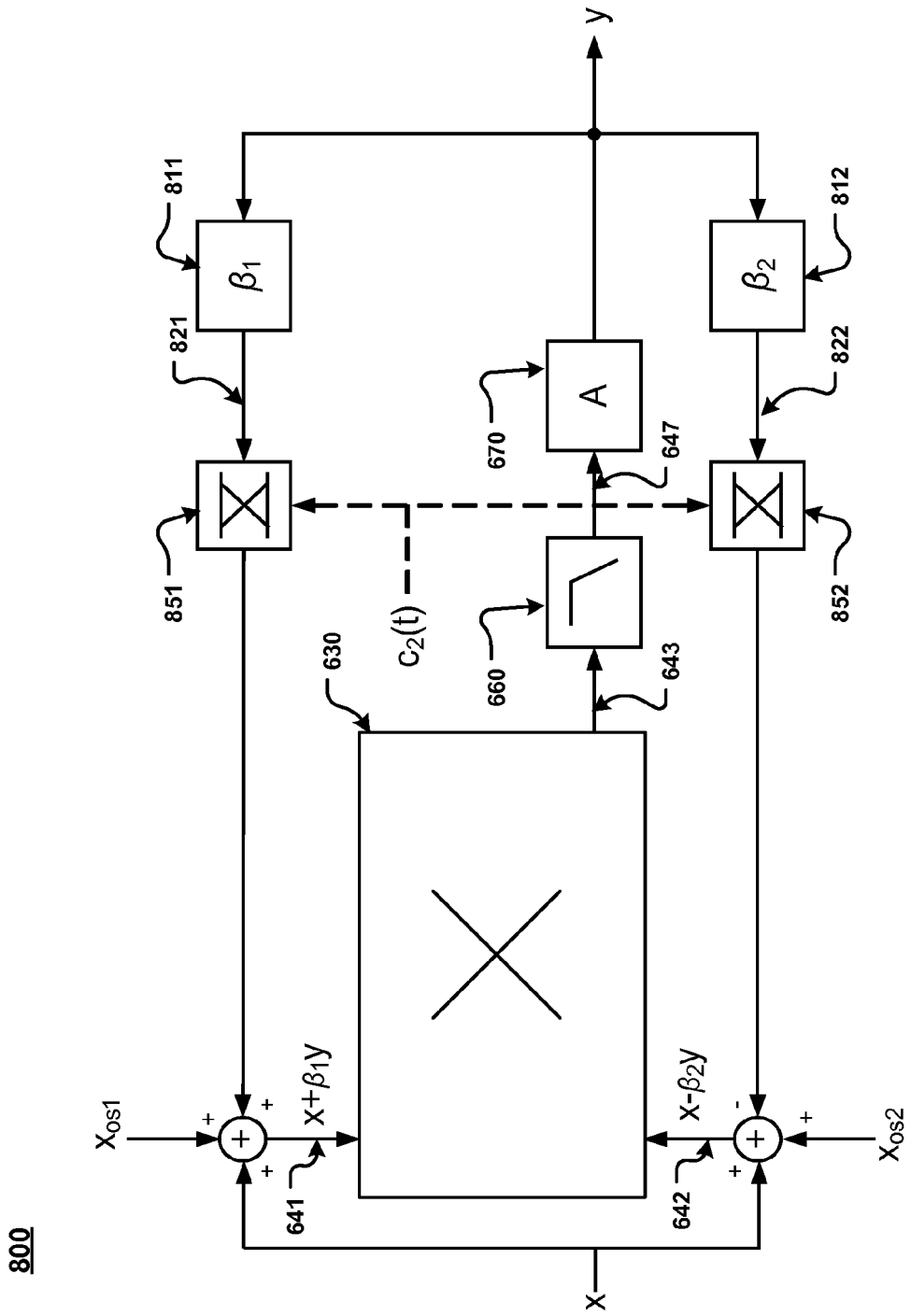
FIG. 8 is a block diagram of an alternative configuration for a RMS-to-DC converter, in accordance with an embodiment of the present invention.

FIG. 8 illustrates an alternative configuration for a RMS-to-DC converter 800, in accordance with an embodiment of the present invention. In the topology depicted in FIG. 8, chopper circuit 651 of converter 600 has been replaced by two separate chopper circuits, 851 and 852, driven by the same chopping signal $c_2(t)$, one chopper circuit for each feedback path around the multiplier 630. This allows low-frequency implementation of the feedback factors $\beta_1$ and $\beta_2$. It is appreciated that both feedback factors $\beta_1$ and $\beta_2$ may also be placed at the output of chopping circuits 851 and 852 in feedback paths 811 and 812. In principle, the three operations (1) splitting of the output signal y to generate two separate feedback paths to the multiplier 630, (2) chopping by a chopper circuit driven by a chopping signal $c_2(t)$, and (3) scaling by feedback factors $\beta_1$ and $\beta_2$, can be placed in the topology of FIGS. 6 and 8 in any order of preference. Embodiments are intended to cover all these possibilities.

The relation between x and y for the configurations in FIGS. 6 and 8, neglecting $X_{os4}$, can be expressed as:

$$y = A\overline{c_1(t)}x_{os3} + AK_m \left[ \overline{c_1^2(t)}^2 x^2 - \beta_1 \beta_2 \overline{c_1^2(t)c_2^2(t)} y^2 + \right. \tag{9}$$
$$(\beta_1 - \beta_2)\overline{c_1^2(t)c_2(t)}xy + (x_{os1} + x_{os2})\overline{x} \Big] +$$
$$\overline{c_1^2(t)}[AK_m(x_{os2}\beta_1 - x_{os1}\beta_2)\overline{c_2(t)}y + AK_m x_{os1} x_{os2}],$$

which for $[c_2(t)]^2 = 1$, high loopgain, and the other previously stated conditions for x, y, $c_1$ and $c_2$ simplifies to:

$$\lim_{A \to \infty} y = \sqrt{\frac{\overline{x^2} + x_{os1} x_{os2}}{\beta_1 \beta_2}}. \tag{10}$$

Except for the second-order offset term $x_{os1}x_{os2}$, this is the same expression found for the ideal RMS-to-DC converter, in the absence of any offset. Since the offsets are usually relatively small, this offset product term is usually negligible.

Figure 9:
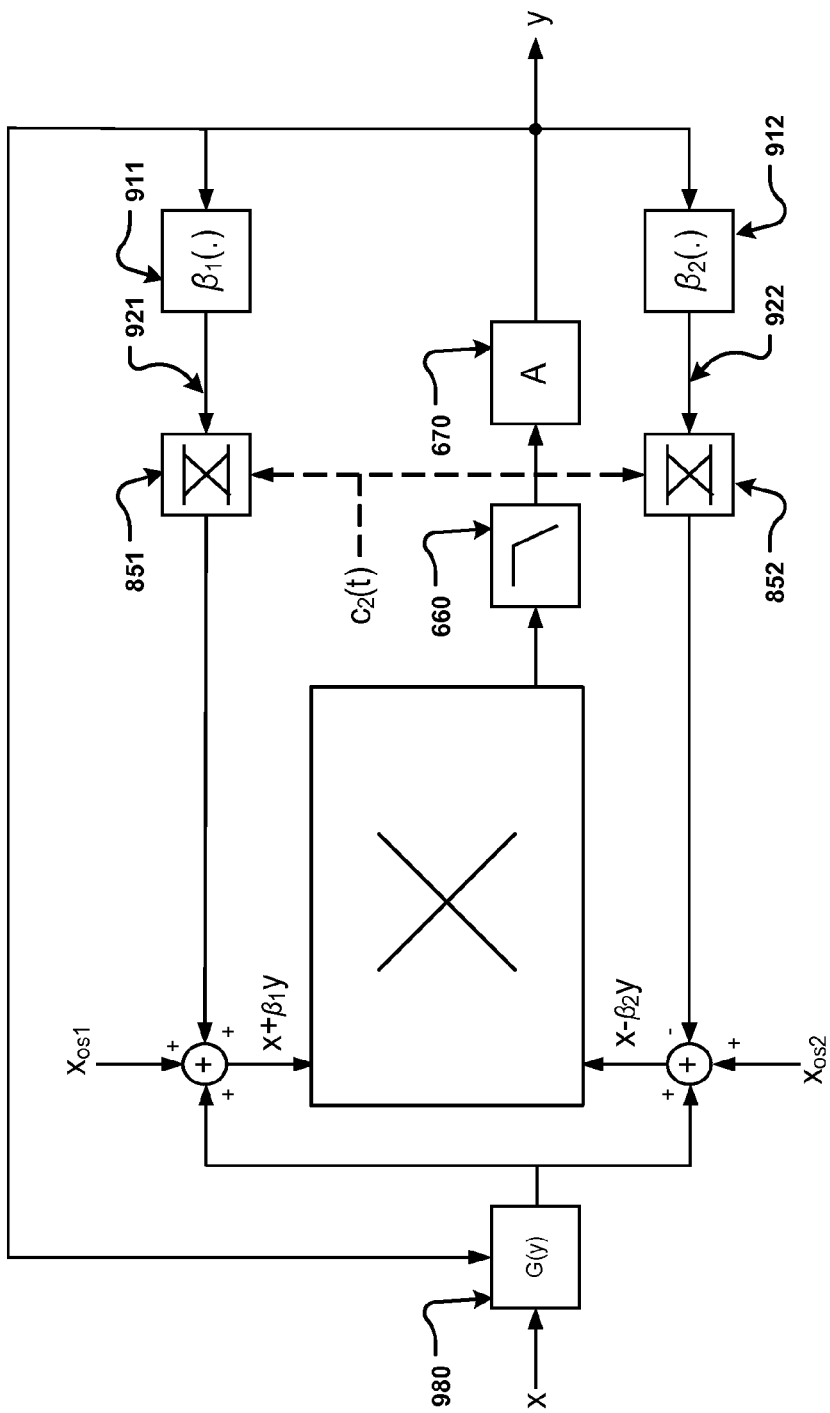
FIG. 9 is a block diagram of an RMS-to-DC converter that includes feedback scaling factors that are dependent on an output signal and a variable gain amplifier, in accordance with an embodiment of the present invention.

Further refinements to embodiments may be achieved by the inclusion of scaling and compression into the converter topologies of FIGS. 6 and 8. This can be achieved in two different ways: (1) by making the scaling factors $\beta_1$ and/or $\beta_2$ dependent on the output signal y; and (2) by insertion of a variable gain amplifier (VGA), controlled by the converter output signal, at the input of the RMS-to-DC converter. The first approach introduces nonlinear feedback around the multiplier, while the second approach compresses the dynamic range of the input signal applied to the RMS-to-DC converter. FIG. 9 illustrates an RMS-to-DC converter 900 that implements both approaches, in accordance with an embodiment of the present invention. In converter 900, the input signal x is amplified by VGA 980 with variable gain G(y) before it is passed to the rest of the RMS-to-DC converter. Additionally, the feedback scaling factors $\beta_1$ and $\beta_2$ are a function of the output signal y. For high loopgain, the relation between input signal and output signal of this topology can be expressed as:

$$\frac{y\sqrt{\beta_1(y)\beta_2(y)}}{G(y)} = \sqrt{\overline{x^2}}. \tag{11}$$

In order to arrive at an explicit expression for y, the following two functions F and H are defined:

$$F(y) = \frac{y\sqrt{\beta_1(y)\beta_2(y)}}{G(y)}, \tag{12}$$
$$H(x) = F^{-1}(x).$$

In this way, the RMS-to-DC converter output signal y can be expressed as:

$$y = H\left(\sqrt{\overline{x^2}}\right). \tag{13}$$

Thus, in order to arrive at a certain RMS-to-DC converter overall transfer H, the transfer of the VGA 980 and the feedback scaling factors $\beta_1$ and $\beta_2$ should be selected such that the function F becomes the inverse of the desired transfer H. For example, if a LOG RMS-DC converter transfer is desired such that:

$$y = {}^{10}\log\left(\sqrt{\overline{x^2}}\right) = \frac{\ln\left(\sqrt{\overline{x^2}}\right)}{\ln(10)} \tag{14}$$

Then the inverse function F to be realized equals:

$$F(y) = \frac{y\sqrt{\beta_1(y)\beta_2(y)}}{G(y)} = \exp[y\ln(10)] \tag{15}$$

It should be appreciated that there are numerous combinations of the VGA 980 gain and feedback scaling factors $\beta_1$ and $\beta_2$ that realize this function. A few examples will be explored below for illustrative purposes.

In the case where no variable gain amplifier (such as VGA 980) is used at the input, G(y)=G, independent of y. In that case, the feedback factors can be chosen such that:

$$\beta_1(y) = \beta_2(y) = \frac{\exp[y\ln(10)]}{y}, \tag{16}$$

or another possibility:

$$\beta_1(y) = \exp[2y\ln(10)], \tag{17}$$
$$\beta_2(y) = \frac{1}{y^2}.$$

If a VGA is used to achieve DR compression at the RMS-DC converter input, then the following choice is possible as well:

$$G(y) = \exp[-y\ln(10)] \tag{18}$$
$$\beta_1(y) = \beta_2(y) = \frac{1}{y}.$$

For electronic implementation of this scheme, the selection of a suitable decomposition of the function F(y) into specific transfers for the VGA and the feedback factors is guided by the following boundary conditions: the set of functions that can be realized in practice with sufficient accuracy; the circuit block having the smallest dynamic range of all; dynamic range compression should concentrate on the input signal of this block; and other considerations such as noise, offset, temperature stability, suitability for high frequency implementation, etc.

Figure 10:
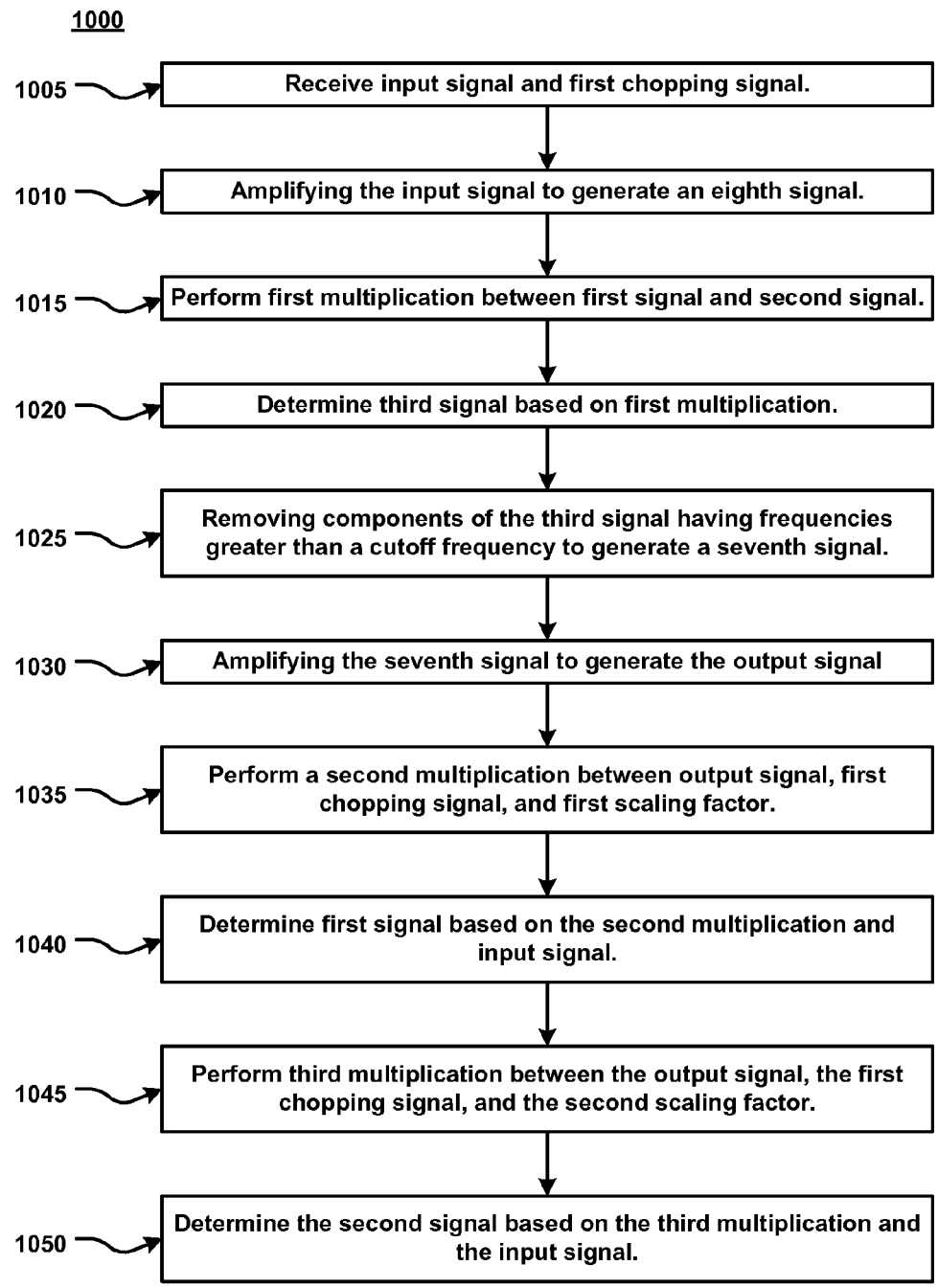
FIG. 10 illustrates a flowchart for a process for reducing offset errors in an RMS-to-DC converter, in accordance with an embodiment of the present invention.

FIG. 10 illustrates a flowchart for a process 1000 for reducing offset errors in an RMS-to-DC converter, in accordance with an embodiment of the present invention. Although specific operations are disclosed in process 1000, such operations are exemplary. Process 1000 may not include all of the operations illustrated by FIG. 10. Also, process 1000 may include various other operations and/or variations of the operations shown by FIG. 10. Likewise, the sequence of the operations of process 1000 can be modified.

At step 1005, an input signal and a first chopping signal are received. At step 1010, the input signal is amplified. Next, a first multiplication is performed between the first signal and a second signal (step 1015). A third signal is then determined based on the first multiplication (step 1020). At step 1025, components of the third signal having frequencies greater than a cutoff frequency are removed in order to generate a seventh signal. In one embodiment, the cutoff frequency is less than the first chopping signal. At step 1030, the seventh signal is amplified to generate the output signal. Next, a second multiplication between the output signal, the first chopping signal, and a first scaling factor is performed (step 1035). The first signal is then determined based on both the second multiplication and the input signal (step 1040). At step 1045, a third modification is performed between the output signal, the first chopping signal, and a second scaling factor. The second signal is then determined based on both the third multiplication in the input signal (step 1050).

Figure 11:
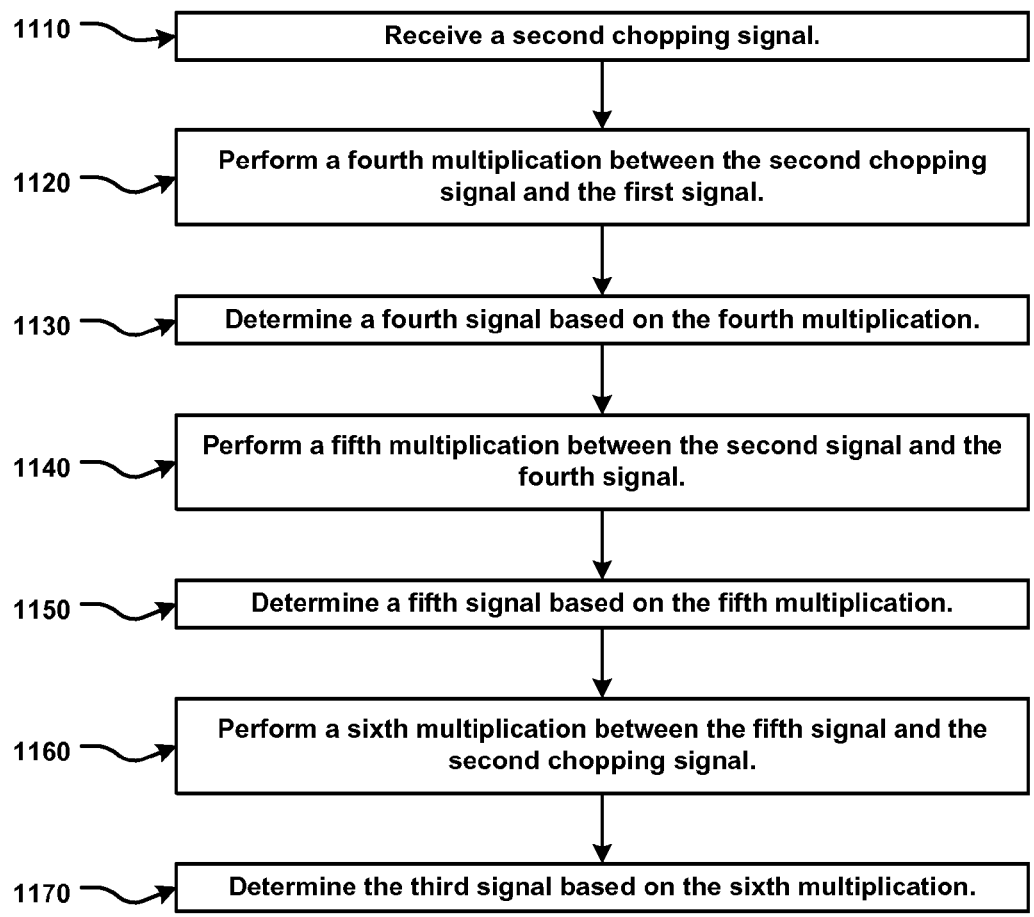
FIG. 11 illustrates a process for determining the third signal as referenced in FIG. 10, in accordance with an embodiment of the present invention.

FIG. 11 illustrates a process 1100 for determining the third signal, in accordance with an embodiment of the present invention. It is appreciated that step 1020 of process 1000 may be achieved in a number of ways. Process 1100 of FIG. 11 is intended to be an illustration of one manner of accomplishing step 1020, and as such is not intended to limit step 1020 solely to process 1100 illustrated in FIG. 11. Moreover, although specific operations are disclosed in process 1100, such operations are exemplary. Process 1100 may not include all of the operations illustrated by FIG. 11. Also, process 1100 may include various other operations and/or variations of the operations shown by FIG. 11. Likewise, the sequence of the operations of process 1100 can be modified.

At step 1110, a second chopping signal is received. A fourth multiplication is then performed between the second chopping signal in the first signal (step 1020). Based on the fourth multiplication, a fourth signal is then determined (step 1130). At step 1140, a fifth multiplication is performed between the second signal and the fourth signal. At step 1150, a fifth signal is then determined based on the fifth multiplication. At step 1160, a sixth multiplication is performed between the fifth signal and the second chopping signal. The third signal is then determined based on the sixth multiplication (step 1170).

Thus, embodiments provide for improved sensitivity in RMS-to-DC converters for very small input signals. Embodiments also improve the temperature stability of such converters by substantially eliminating temperature dependent offsets. Moreover, embodiments provide for low-cost fabrication of high-performance RMS-to-DC converters by substantially eliminating the need for expensive offset trim and calibration procedures. Additionally, embodiments allow for the extension of the dynamic range of such converters by means of nonlinear feedback inside the converters and input scaling using a variable gain amplifier.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A converter comprising:
a first feedback path for generating a first feedback signal;
a second feedback path for generating a second feedback signal;
a first multiplier circuit coupled to receive a first signal and a second signal, wherein the first signal is based on an input signal and the first feedback signal, and wherein the second signal is based on the input signal and the second feedback signal, the first multiplier circuit being further coupled to provide a third signal based on multiplying the first signal and the second signal;
wherein the first feedback path comprises a first scaling factor dependent on an output signal, and wherein the output signal is based on the third signal; and
a first chopper circuit coupled to receive the first scaling factor and a chopping signal, wherein the first feedback path comprises the first chopper circuit.

2. The converter of claim 1 wherein the second feedback path comprises a second scaling factor dependent on the output signal.

3. The converter of claim 2 further comprising a second chopper circuit coupled to receive the second scaling factor and the chopping signal, wherein the second feedback path comprises the second chopper circuit.

4. The converter of claim 3 further comprising a variable gain amplifier coupled to receive the input signal and provide an amplified input signal, wherein the variable gain amplifier is controlled by the output signal.

5. The converter of claim 1 further comprising a lowpass filter coupled to receive the third signal.

6. The converter of claim 1 further comprising an amplifier coupled to the first multiplier circuit, the amplifier being coupled to provide the output signal.

7. The converter of claim 6 further comprising a lowpass filter coupled to receive the third signal and provide a fourth signal, wherein the amplifier is coupled to receive the further signal.

\* \* \* \* \*